United States Patent
Sakuma et al.

(10) Patent No.: US 9,198,284 B2
(45) Date of Patent: Nov. 24, 2015

(54) CIRCUIT BOARD AND METHOD FOR MANUFACTURING SAME

(75) Inventors: Haruya Sakuma, Fukushima (JP); Masataka Saitoh, Yamagata (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 149 days.

(21) Appl. No.: 13/809,186

(22) PCT Filed: Dec. 20, 2010

(86) PCT No.: PCT/JP2010/007354
§ 371 (c)(1),
(2), (4) Date: Jan. 9, 2013

(87) PCT Pub. No.: WO2012/017507
PCT Pub. Date: Feb. 9, 2012

(65) Prior Publication Data
US 2013/0107484 A1    May 2, 2013

(30) Foreign Application Priority Data
Aug. 6, 2010 (JP) ................. 2010-176990

(51) Int. Cl.
*H05K 1/18* (2006.01)
*H05K 3/34* (2006.01)
(Continued)

(52) U.S. Cl.
CPC ........ *H05K 1/0296* (2013.01); *H01L 23/49816* (2013.01); *H01L 23/49838* (2013.01); *H05K 1/111* (2013.01); *H01L 24/48* (2013.01); *H01L 2224/48227* (2013.01); *H01L 2224/48229* (2013.01); *H01L 2924/15184* (2013.01);
(Continued)

(58) Field of Classification Search
CPC ..... H05K 1/181; H05K 1/141; H05K 3/3436; H05K 2201/09772; H05K 2201/094; H01L 2224/16
USPC .......................................... 361/768, 772–779
See application file for complete search history.

(56) References Cited

U.S. PATENT DOCUMENTS 3,458,925 A * 8/1969 Napier et al. ................. 438/613
3,871,014 A * 3/1975 King et al. .................... 257/779
(Continued)

FOREIGN PATENT DOCUMENTS

| CN | 1411045 | 4/2003 |
| CN | 1742371 | 3/2006 |

(Continued)

OTHER PUBLICATIONS

International Search Report of PCT Application No. PCT/JP2010/007354 dated Jan. 25, 2011.
(Continued)

*Primary Examiner* — Jeremy C Norris
*Assistant Examiner* — Nathan Milakovich
(74) *Attorney, Agent, or Firm* — Panasonic Patent Center (57) ABSTRACT

A semiconductor device (20) has a plurality of device-side lands (23) which are disposed asymmetrically in relation to an intersection point (B). The plurality of device-side lands (23) include 45 device-side connection lands and four device-side isolation lands. Each of the device-side connection lands is mechanically connected to a printed board (10) via a connection component (30). Each of the device-side isolation lands is mechanically isolated from the printed board (10).

15 Claims, 8 Drawing Sheets (51) Int. Cl.
  *H05K 1/02* (2006.01)
  *H01L 23/498* (2006.01)
  *H05K 1/11* (2006.01)
  *H01L 23/00* (2006.01)

(52) U.S. Cl.
  CPC ..... *H01L2924/15311* (2013.01); *H05K 3/3436* (2013.01); *H05K 2201/09781* (2013.01)

(56) References Cited

U.S. PATENT DOCUMENTS

| | | | |
|---|---|---|---|
| 5,157,480 A * | 10/1992 | McShane et al. | 257/693 |
| 5,186,383 A * | 2/1993 | Melton | B23K 1/0016 228/180.22 |
| 5,269,453 A * | 12/1993 | Melton et al. | 228/180.22 |
| 5,465,152 A * | 11/1995 | Bilodeau | G01B 11/306 257/E21.511 |
| 5,726,502 A * | 3/1998 | Beddingfield | 257/797 |
| 5,828,128 A * | 10/1998 | Higashiguchi et al. | 257/738 |
| 5,859,474 A * | 1/1999 | Dordi | 257/737 |
| 5,901,442 A * | 5/1999 | Harada | 29/882 |
| 6,222,277 B1 * | 4/2001 | Downes | 257/778 |
| 6,225,702 B1 * | 5/2001 | Nakamura | 257/786 |
| 6,265,783 B1 | 7/2001 | Juso et al. | |
| 6,380,621 B1 * | 4/2002 | Ando et al. | 257/707 |
| 6,677,677 B2 * | 1/2004 | Kimura et al. | 257/737 |
| 6,762,495 B1 | 7/2004 | Reyes et al. | |
| 6,781,245 B2 * | 8/2004 | Huang | 257/780 |
| 6,940,168 B2 * | 9/2005 | Garrity et al. | 257/738 |
| 6,950,315 B2 * | 9/2005 | Ujiie et al. | 361/777 |
| 7,109,583 B2 * | 9/2006 | Johnson | 257/734 |
| 7,242,093 B2 | 7/2007 | Ueda | |
| 7,274,090 B2 | 9/2007 | Tanaka | |
| 7,361,997 B2 * | 4/2008 | Yashiro | 257/786 |
| 7,368,821 B2 * | 5/2008 | Kim et al. | 257/738 |
| 7,449,716 B2 * | 11/2008 | Chen | H01L 22/12 257/48 |
| 7,525,201 B2 * | 4/2009 | Takahira | 257/797 |
| 7,550,829 B2 | 6/2009 | Tanaka | |
| 7,687,803 B2 | 3/2010 | Takagi et al. | |
| 7,728,430 B2 | 6/2010 | Yamaguchi | |
| 7,989,959 B1 * | 8/2011 | Rahman | 257/777 |
| 8,072,769 B2 | 12/2011 | Leki et al. | |
| 8,093,708 B2 * | 1/2012 | Lovskog | 257/693 |
| 8,525,333 B2 | 9/2013 | Kanetaka | |
| 8,791,554 B2 * | 7/2014 | Kwak et al. | 257/659 |
| 2003/0060035 A1 | 3/2003 | Kimura et al. | |
| 2004/0017008 A1 | 1/2004 | Ueda | |
| 2006/0001135 A1 | 1/2006 | Tanaka | |
| 2006/0279315 A1 | 12/2006 | Takagi et al. | |
| 2008/0001265 A1 | 1/2008 | Tanaka | |
| 2008/0169561 A1 | 7/2008 | Yamaguchi | |
| 2009/0072385 A1 * | 3/2009 | Alley et al. | 257/713 |
| 2010/0027225 A1 | 2/2010 | Yuda et al. | |
| 2011/0006433 A1 | 1/2011 | Kanetaka | |

FOREIGN PATENT DOCUMENTS

| | | | |
|---|---|---|---|
| DE | 10341206 A1 * | 4/2005 | H01L 23/50 |
| JP | 11-132737 | 5/1999 | |
| JP | 2000-216281 | 8/2000 | |
| JP | 2003-100801 | 4/2003 | |
| JP | 2003-110055 | 4/2003 | |
| JP | 2004-63761 | 2/2004 | |
| JP | 2005-108996 | 4/2005 | |
| JP | 2006-019338 | 1/2006 | |
| JP | 2006-294670 | 10/2006 | |
| JP | 2006-344824 | 12/2006 | |
| JP | 2008-172060 | 7/2008 | |
| WO | 2008/136251 | 11/2008 | |
| WO | 2009/116517 | 9/2009 | |

OTHER PUBLICATIONS

Chinese Office Action dated Nov. 19, 2014, for the related Chinese Patent Application No. 201080067544.X.

* cited by examiner

CIRCUIT BOARD AND METHOD FOR MANUFACTURING SAME

TECHNICAL FIELD

The present invention relates to a circuit board comprising a semiconductor device and a printed board, and to a method for manufacturing this circuit board.

BACKGROUND ART

Conventional electronic devices such as portable telephones, personal computers, and video devices make use of a circuit board equipped with a printed board and a semiconductor device that is mounted on the printed board. A well known semiconductor device is an array package such as a ball grid array (BGA) or land grid array (LGA) type of chip-size package (CSP). Such a semiconductor device has a plurality of device-side lands that are mechanically connected to the printed board with solder.

The plurality of device-side lands here are sometimes disposed asymmetrically so that the orientation of the semiconductor device can be automatically determined by a conveyor robot (see Patent Literature 1 and 2, for example).

CITATION LIST

Patent Literature

Patent Literature 1: Japanese Laid-Open Patent Application H11-132737
Patent Literature 2: Japanese Laid-Open Patent Application 2006-294670

SUMMARY

Technical Problem

However, when a plurality of device-side lands are disposed asymmetrically, when the device-side lands are soldered to the printed board, cracking may occur near the boundary between the solder and the device-side lands. Soldering defects such as this can prevent the semiconductor device from operating properly.

The present invention was conceived in an effort to solve the above problem, and it is an object thereof to provide a circuit board that is less susceptible to soldering defects, and a method for manufacturing this circuit board.

Solution to Problem

The circuit board pertaining to the present invention comprises a printed board and a semiconductor device that is mounted to the printed board and includes a plurality of device-side lands disposed asymmetrically in relation to a specific reference point, the plurality of device-side lands having a plurality of device-side connection lands and a device-side isolation land, the plurality of device-side connection lands mechanically connected to the printed board with solder, the device-side isolation land mechanically isolated from the printed board.

Advantageous Effects

A circuit board that is less susceptible to soldering defects, and a method for manufacturing this circuit board, can be provided with the present invention.

DESCRIPTION OF EMBODIMENTS

Next, an embodiment of the present invention will be described through reference to the drawings. In the following description of the drawings, those portions that are the same or similar will be given the same or similar numbers. These drawings are merely schematics, however, and the actual dimensional proportions and so forth may differ from those in the drawings. Therefore, the specific dimensions and so forth should be determined by reference to the following description. Also, dimensional interrelations and proportions may vary from one drawing to the next.

1. Summary

In this embodiment, when a semiconductor device is soldered to a printed board, the moment of the force exerted on the semiconductor device is balanced using a specific axis as a reference, thereby suppressing inclination of the semiconductor device with respect to the printed board.

The configuration of printed board, the semiconductor device, and the circuit board, and the method for manufacturing the circuit board will now be described in that order.

2. Configuration of Printed Board

Figure 1:
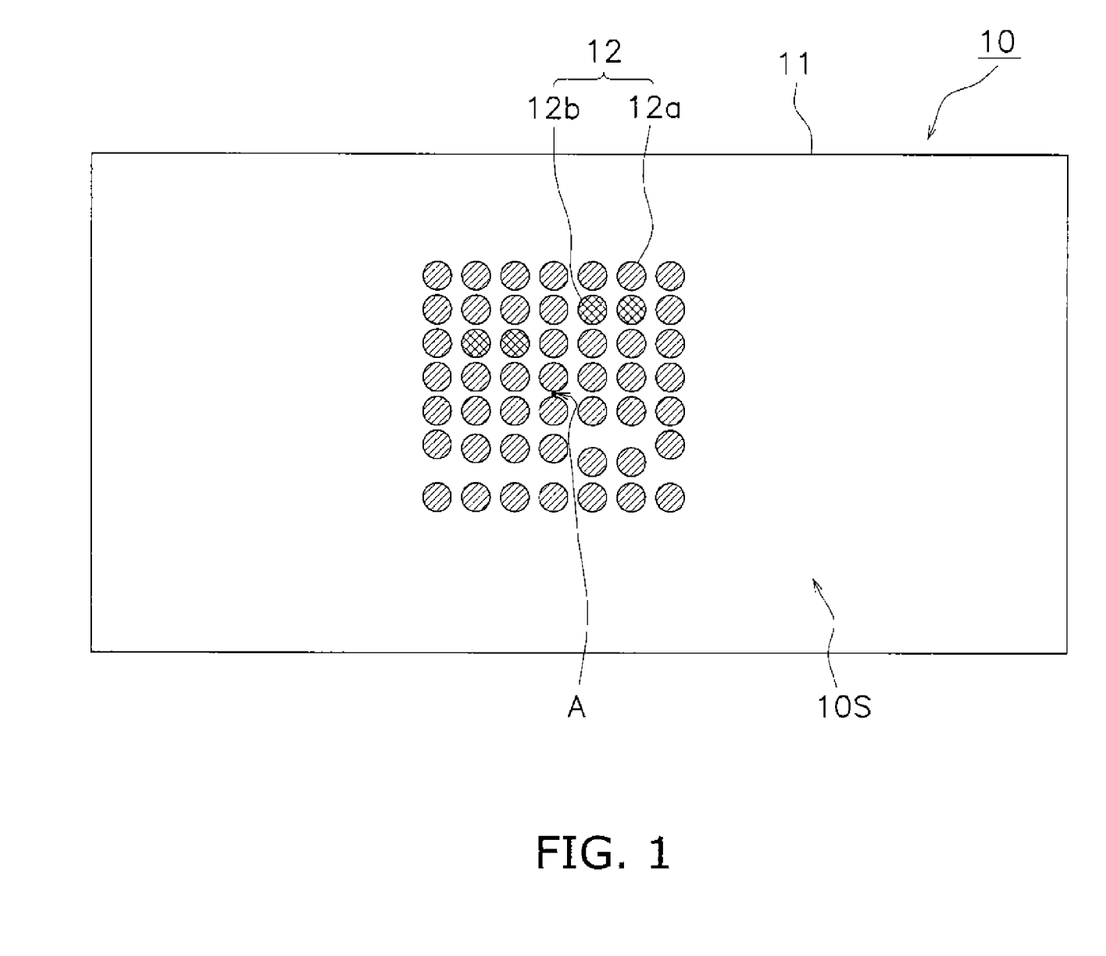
FIG. 1 is a plan view of a printed board 10 pertaining to an embodiment.

The configuration of the printed board pertaining to an embodiment will be described through reference to the drawings. FIG. 1 is a plan view of the printed board 10 pertaining to an embodiment, as seen from a mounting face 10S side.

As shown in FIG. 1, the printed board 10 has a board main body 11 and a plurality of board-side lands 12.

The board main body 11 is a flat member made up of paper phenolic, glass epoxy, or the like. The board main body 11 has the mounting face 10S. Electronic parts (such as a CPU, resistors, or capacitors) (not shown) are mounted on the mounting face 10S. In this embodiment, the semiconductor device 20 is mounted on the mounting face 10S, as will be discussed below.

The board-side lands 12 are terminals for mounting the semiconductor device 20. The board-side lands 12 are provided on the mounting face 10S. The board-side lands 12 are constituted by copper foil, for example.

The board-side lands 12 are disposed asymmetrically in relation to a specific reference point A in a plan view of the mounting face 10S. Specifically, the layout of the board-side lands 12 is not in point symmetry. The specific reference point A is the center point of all of the board-side lands 12.

In this embodiment, the board-side lands 12 include 45 board-side connection lands 12a and four board-side isolation lands 12b. Each of the board-side connection lands 12a is mechanically connected to the semiconductor device 20 via a connection component 30 (discussed below; see FIG. 5). Each of the board-side isolation lands 12b is mechanically isolated from the semiconductor device 20. Thus, the 45 board-side connection lands 12a (some of the board-side lands 12) contribute to the joining of the semiconductor device 20, whereas the four board-side isolation lands 12b do not contribute to the joining of the semiconductor device 20. Nevertheless, the board-side connection lands 12a and the board-side isolation lands 12b have the same configuration.

As will be discussed below, in the mounting of the semiconductor device 20 to the printed board 10, the 45 board-side connection lands 12a are coated with a cream solder 40, whereas the four board-side isolation lands 12b are not coated with the cream solder 40.

3. Configuration of Semiconductor Device

Figure 2:
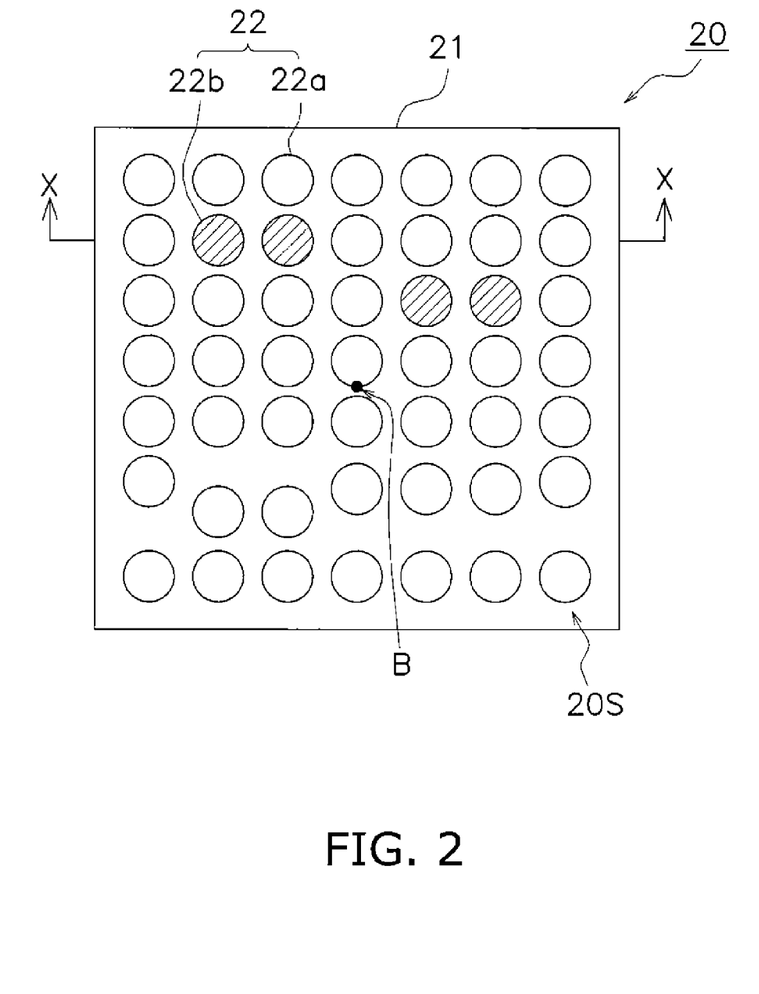
FIG. 2 is a plan view of a semiconductor device 20 pertaining to an embodiment.
Figure 3:
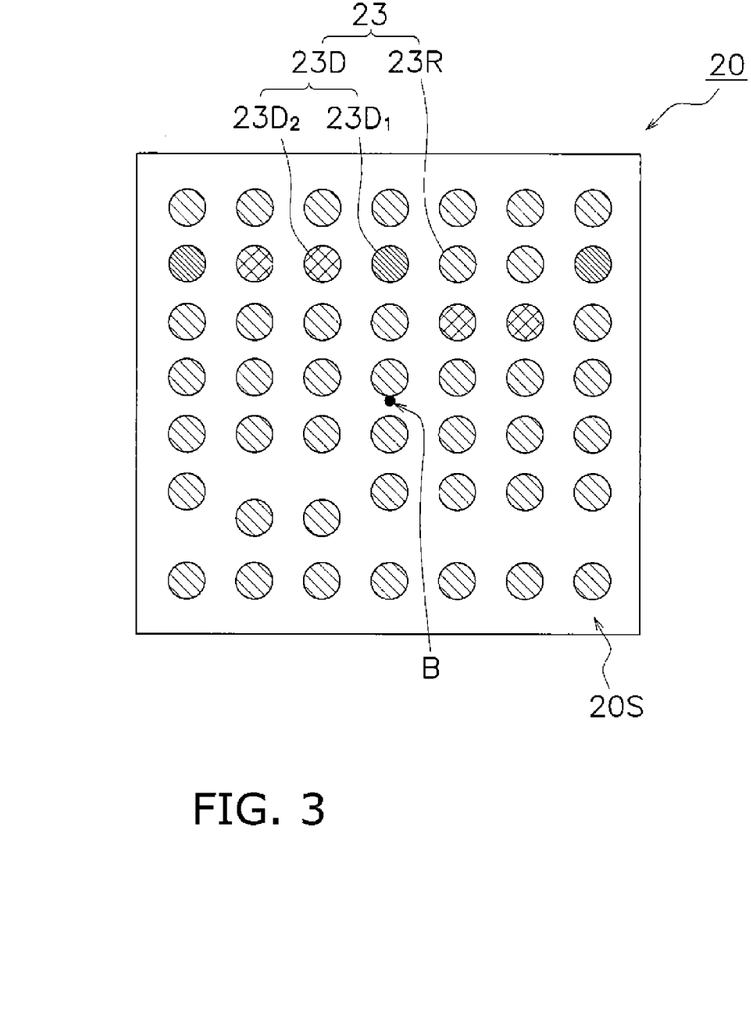
FIG. 3 is a plan view of the semiconductor device 20 pertaining to an embodiment.
Figure 4:
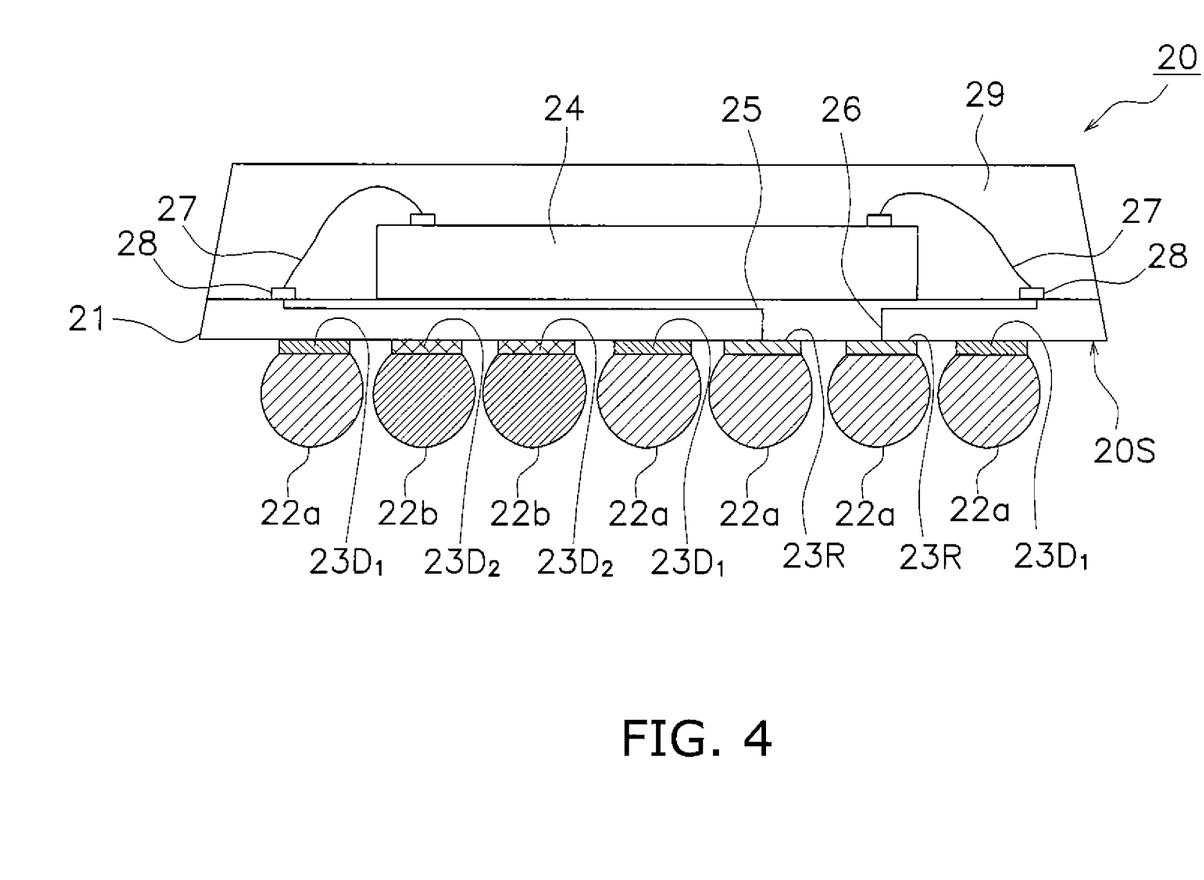
FIG. 4 is a cross section along the X-X line in FIG. 2.

The configuration of the semiconductor device pertaining to an embodiment will be described through reference to the drawings. FIG. 2 is a plan view of the semiconductor device 20 pertaining to an embodiment, as seen from an opposing face 20S side. FIG. 3 is a plan view of the semiconductor device 20 (with a plurality of solder balls 22 omitted) as seen from the opposing face 20S side. FIG. 4 is a cross section along the X-X line in FIG. 2.

As shown in FIG. 2, the semiconductor device 20 has a package board 21 and a plurality of solder balls 22. An array package such as a ball grid array (BGA) or land grid array (LGA) type of chip-size package (CSP) can be used as the semiconductor device 20.

The package board 21 is a flat member made from an insulating material. The package board 21 has the opposing face 20S that opposes the mounting face 10S.

The solder balls 22 are spherical members provided on the opposing face 20S. The solder balls 22 are made of solder (such as an Sn3Ag0.5Cu alloy (3 wt % silver, 0.5 wt % copper, and the remainder tin). The solder balls 22 are disposed asymmetrically in relation to an intersection point B between the semiconductor device 20 and a perpendicular line passing through the center of gravity of the semiconductor device 20 and perpendicular to the opposing face 20S. In this embodiment, the intersection point B passes through the approximate center of the opposing face 20S.

The solder balls 22 include 45 connection balls 22a and four isolation balls 22b. Each of the connection balls 22a is mechanically connected to the printed board 10 and the semiconductor device 20 by constituting part of a connection component 30 (see FIG. 5) in the mounting of the semiconductor device 20. Each of the isolation balls 22b does not constitute part of a connection component 30, and so is not mechanically connected to the printed board 10 and the semiconductor device 20. Thus, the 45 connection balls 22a that are part of the solder balls 22 contribute to the joining of the semiconductor device 20, whereas the four isolation balls 22b do not contribute to the joining of the semiconductor device 20. Nevertheless, the connection balls 22a and the isolation balls 22b have the same configuration.

As shown in FIG. 3, the semiconductor device 20 has a plurality of device-side lands 23. The device-side lands 23 are disposed asymmetrically in relation to the intersection point B.

In this embodiment, the device-side lands 23 include 42 real lands 23R and seven dummy lands 23D.

The 42 real lands 23R are mechanically connected to the printed board via the connection components 30 (see FIG. 5) in the mounting of the semiconductor device 20. Each of the real lands 23R is electrically connected to a semiconductor element 24 (see FIG. 4) disposed in the semiconductor device 20. Therefore, each of the real lands 23R contributes to the function of the semiconductor device 20. The 42 real lands 23R include a plurality of signal terminals, a plurality of power supply terminals, a plurality of grounding terminals, and so forth.

The seven dummy lands 23D are electrically isolated from the semiconductor element 24 (see FIG. 4). Therefore, each of the dummy lands 23D does not contribute to the function of the semiconductor device 20.

The seven dummy lands 23D include three first dummy lands $23D_1$ and four second dummy lands $23D_2$. The first dummy lands $23D_1$ are similar to the 42 real lands 23R in that they are mechanically connected to the printed board via the connection components 30. The second dummy lands $23D_2$ are unlike the first dummy lands $23D_1$ in that they are mechanically isolated from the printed board.

In this embodiment, the 42 real lands 23R and the three first dummy lands $23D_1$ are respectively connected to the board-side connection lands 12a. Thus, the 42 real lands 23R and the three first dummy lands $23D_1$ constitute 45 "device-side connection lands" disposed corresponding to the 45 board-side connection lands 12a. In the following description, the real lands 23R and the first dummy lands $23D_1$ will sometimes be collectively referred to as "device-side connection lands." As shown in FIG. 3, the 45 device-side connection lands are disposed asymmetrically in relation to the intersection point B.

Also, in this embodiment, the four second dummy lands $23D_2$ are disposed isolated from the four board-side isolation lands 12b. Consequently, the second dummy lands $23D_2$ constitute "device-side isolation lands" that do not contribute to the function of the semiconductor device 20, and do not contribute to the joining of the printed board 10 and the semiconductor device 20. In the following description, the second dummy lands $23D_2$ will sometimes be collectively referred to as "device-side isolation lands."

As shown in FIG. 4, the semiconductor device 20 has the semiconductor element 24, a first internal wire 25, a second internal wire 26, a wire 27, an electrode 28, and a housing 29.

The semiconductor element 24 is an active element such as a transistor or an integrated circuit. The semiconductor element 24 is electrically connected to the electrode 28 of the package board 21 via the wire 27. One of the real lands 23R is electrically connected to the electrode 28 via the first internal wire 25. Another of the real lands 23R is electrically connected to the electrode 28 via the second internal wire 26. Consequently, the semiconductor element 24 is electrically connected to two of the real lands 23R. Meanwhile, three of the first dummy lands $23D_1$ and two of the second dummy lands $23D_2$ are electrically isolated from the semiconductor element 24.

The housing 29 is made of plastic. The housing 29 seals in the semiconductor element 24, a conductive adhesive film 25, a solder layer 26, and the wire 27.

4. Configuration of Circuit Board

Figure 5:
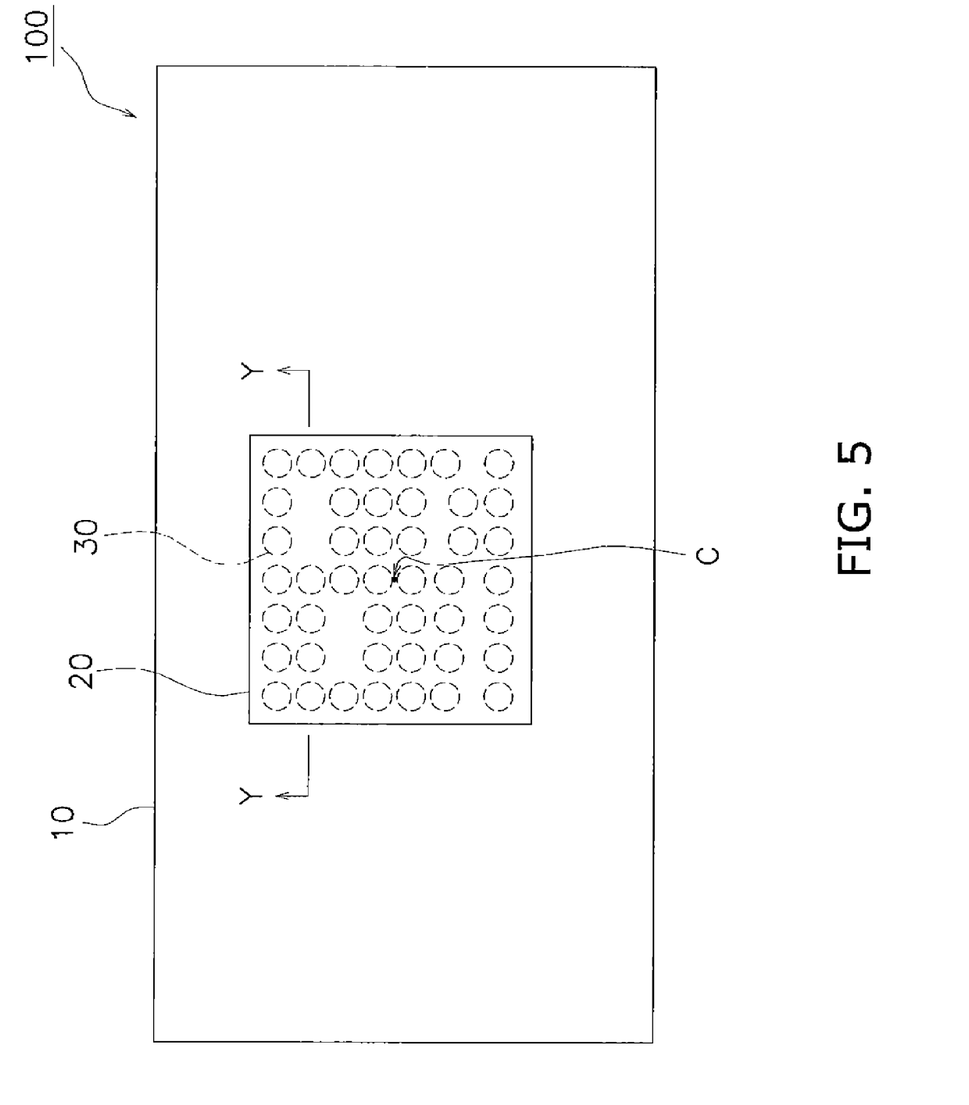
FIG. 5 is a plan view of a circuit board 100 pertaining to an embodiment.
Figure 6:
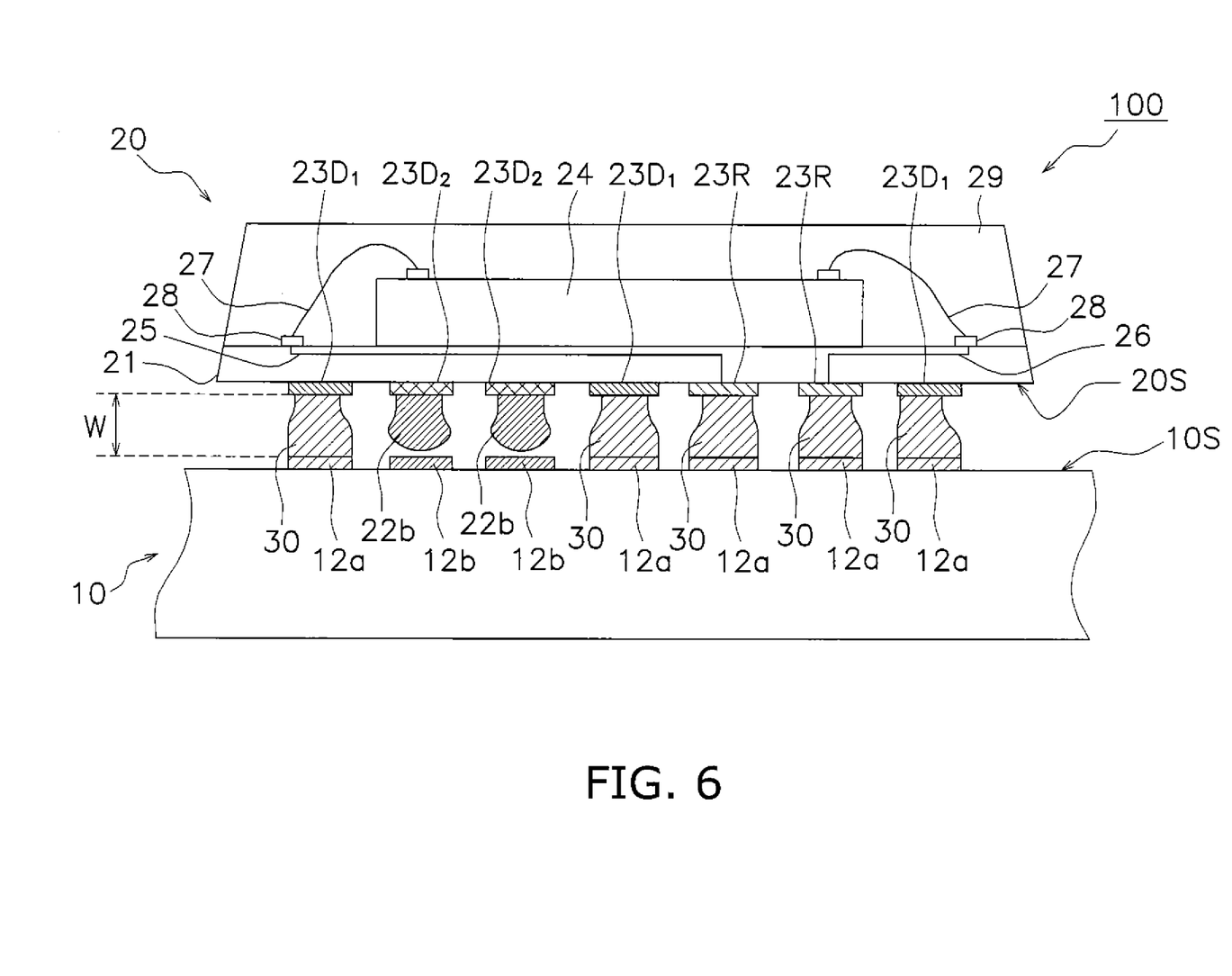
FIG. 6 is a cross section along the Y-Y line in FIG. 5.

The configuration of the circuit board pertaining to this embodiment will be described through reference to the drawings. FIG. 5 is a plan view of a circuit board 100 pertaining to an embodiment, as seen from the mounting face 10S side. FIG. 6 is a cross section along the Y-Y line in FIG. 5. In FIG. 5, the 45 connection components 30 are indicated by broken lines, and the four isolation balls 22b are not shown.

As shown in FIG. 5, the semiconductor device 20 is mounted to the printed board 10 via the 45 connection components 30. In this embodiment, the 45 connection components 30 are disposed asymmetrically in relation to a perpendicular line C that passes through the center of gravity of the semiconductor device 20 and is perpendicular to the mounting face 10S. In this embodiment, the perpendicular line C passes through the intersection point B.

As shown in FIG. 6, the device-side lands 23 include a plurality of device-side connection lands that are mechanically connected to a printed board via the connection components 30. More specifically, the seven device-side lands 23 depicted here include three first dummy lands $23D_1$ and two real lands 23R that are mechanically connected to five board-side connection lands 12a.

The device-side lands 23 also include device-side isolation lands that are mechanically isolated from the printed board 10. More specifically, the seven device-side lands 23 depicted here include second dummy lands $23D_2$ that are mechanically isolated from two board-side isolation lands 12b.

Thus, the connection components 30 mechanically connect the board-side connection lands 12a with the real lands 23R or the first dummy lands $23D_1$. The connection components 30, as discussed below, are formed by melting the connection balls 22a with the cream solder 40 that coat the board-side connection lands 12a.

Meanwhile, as discussed above, since the board-side isolation lands 12b are not coated with the cream solder 40, the isolation balls 22b do not form connection components 30, and maintain their original state. Accordingly, the isolation balls 22b are isolated from the board-side isolation lands 12b.

In this embodiment, the spacing W is uniform between the printed board 10 (each of the board-side lands 12) and each of the device-side connection lands (each of the real lands 23R and the first dummy lands $23D_1$). Also, in this embodiment the opposing face 20S is substantially parallel to the mounting face 10S. Specifically, the semiconductor device 20 is not inclined with respect to the printed board 10.

5. Method for Manufacturing Circuit Board

Figure 7A:
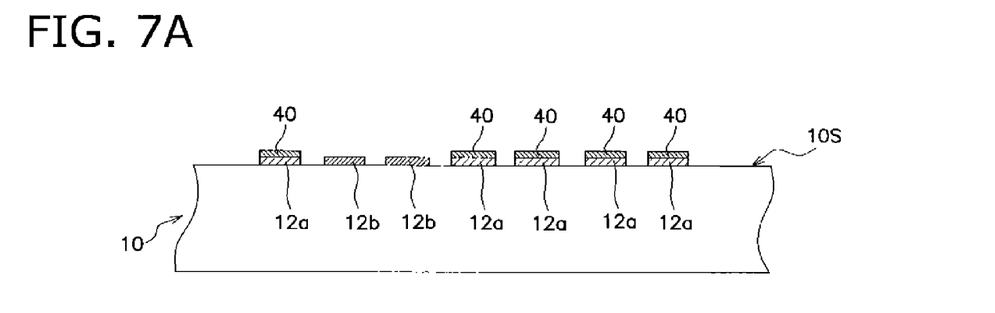
FIG. 7A is a diagram illustrating the method for manufacturing the circuit board 100 pertaining to an embodiment.
Figure 7B:
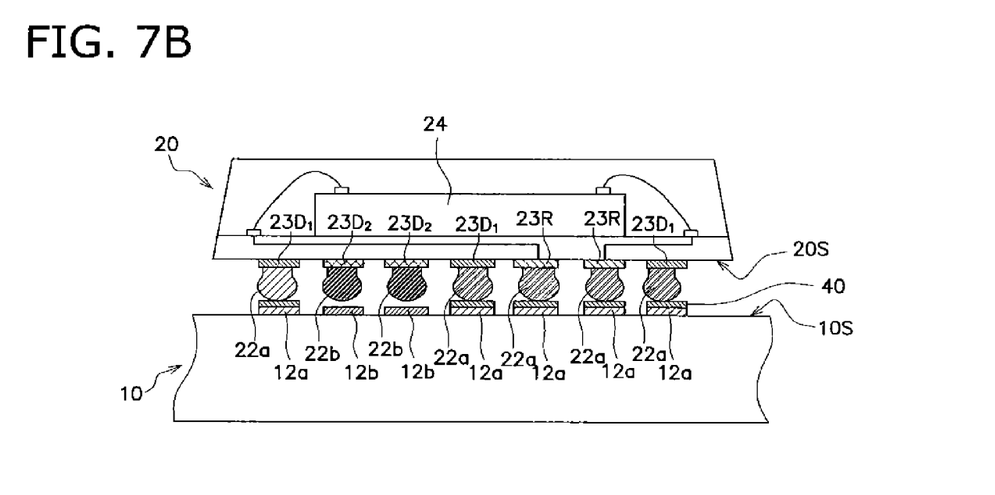
FIG. 7B is a diagram illustrating the method for manufacturing the circuit board 100 pertaining to an embodiment.
Figure 7C:
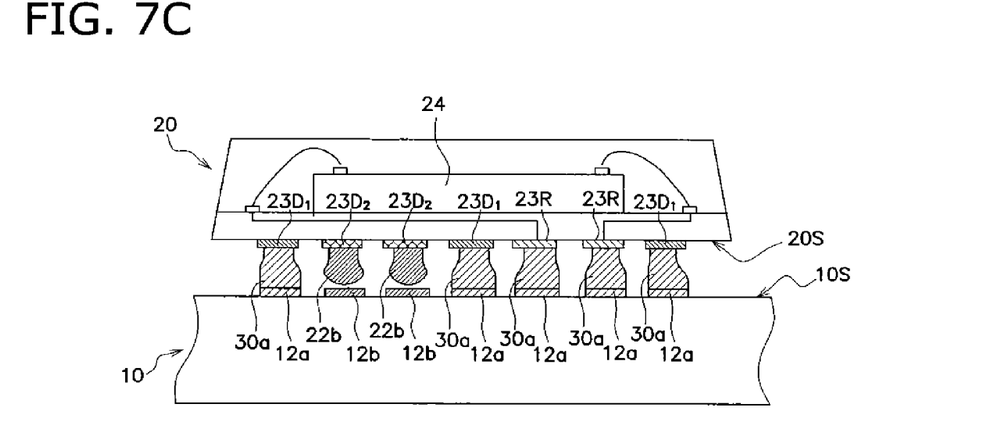
FIG. 7C is a diagram illustrating the method for manufacturing the circuit board 100 pertaining to an embodiment.

The method for manufacturing the circuit board pertaining to an embodiment will be described through reference to the drawings. FIGS. 7A to 7C are cross sections illustrating the method for manufacturing the circuit board 100 pertaining to an embodiment.

First, as shown in FIG. 7A, the 45 board-side connection lands 12a that are some of the board-side lands 12 provided to the printed board 10 are coated with the cream solder 40. The four board-side isolation lands 12b are not coated with the cream solder 40.

The lands that are to be coated with the cream solder 40 (hereinafter referred to as "the target lands") are selected from the device-side lands 23 so that the semiconductor device 20 will not tilt in the solidification of the fused parts 30a (discussed below).

Figure 8:
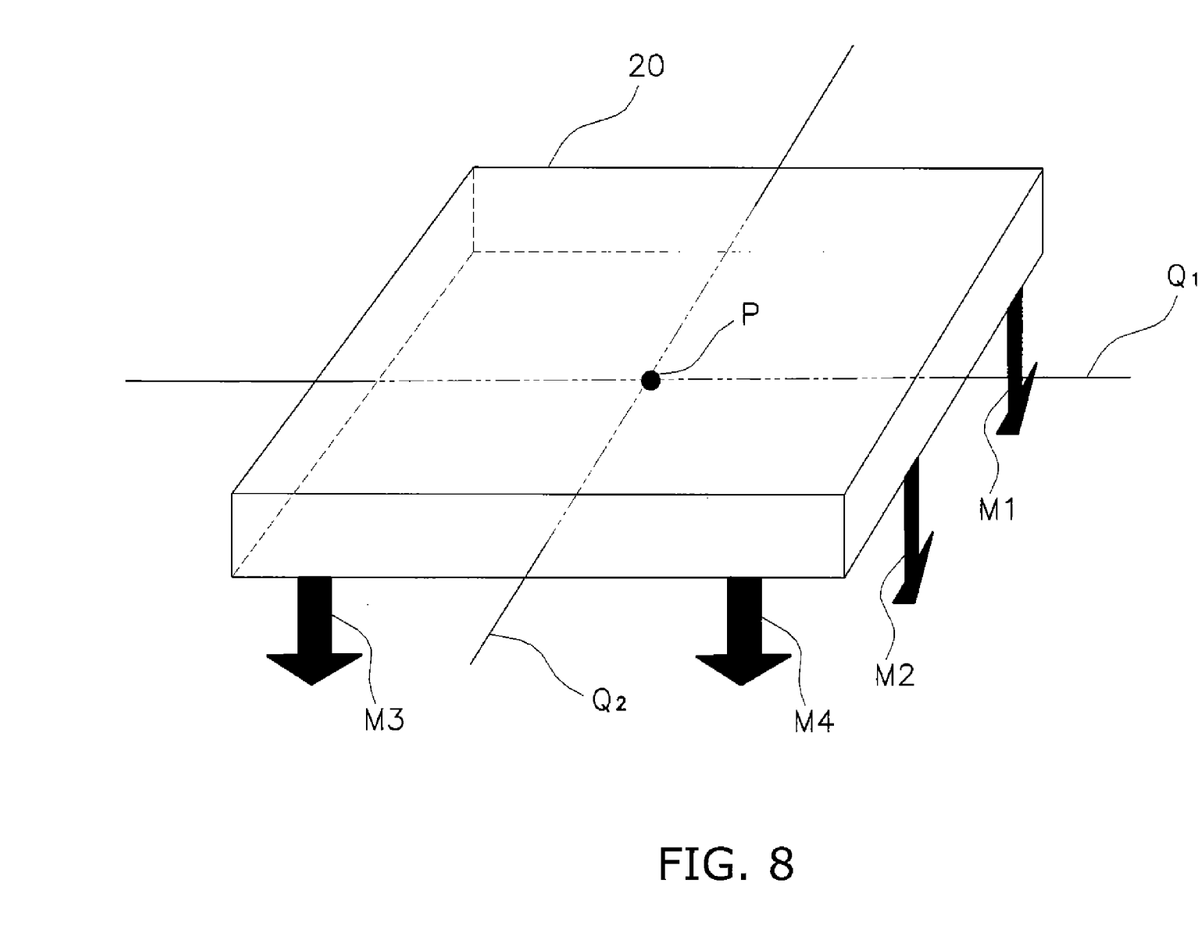
FIG. 8 is a schematic diagram of the moment of force exerted on the semiconductor device 20 pertaining to an embodiment.

More specifically, the target lands are selected so as to balance the moment by which the fused parts 30a try to rotate the semiconductor device 20, using as a reference a plurality of axes that are parallel to the opposing face 20S and pass through the center of gravity of the semiconductor device 20 (see FIG. 8). In this embodiment, only the second dummy lands $23D_2$ of the device-side lands 23 are excluded from the target lands.

Next, as shown in FIG. 7B, the semiconductor device 20 is placed on the printed board 10 coated with the cream solder 40. The lower ends of the connection balls 22a come into contact with the cream solder 40 coating the board-side connection lands 12a. Meanwhile, since the board-side isolation lands 12b are not coated with the cream solder 40, the lower ends of the isolation balls 22b do not come into contact with the cream solder 40. The lower ends of the isolation balls 22b may, however, come into contact with the board-side isolation lands 12b.

Next, as shown in FIG. 7C, the printed board 10 and the semiconductor device 20 are put in a reflow furnace or other such heating apparatus, and the solder balls 22 are heated to over their melting point. The 45 connection balls 22a and the cream solder 40 fuse at this point, forming the 45 fused parts 30a. Meanwhile, although the isolation balls 22b melt, since the four board-side isolation lands 12b are not coated with the cream solder 40, the isolation balls 22b do not fuse with the cream solder 40.

Next, the printed board 10 and the semiconductor device 20 are taken out of the heating apparatus, and the 45 fused parts 30a and the four isolation balls 22b are cooled. This solidifies the 45 fused parts 30a, and forms the 45 connection components 30. As a result, the 45 board-side connection lands 12a are soldered to the 45 device-side connection lands. The four isolation balls 22b, on the other hand, return to their original state upon solidifying.

The fused parts 30a here attempt to form small balls under surface tension when liquefying by melting, and try to shrink when solidifying, so the device-side connection lands are pulled to the printed board 10 side by the fused parts 30a. Accordingly, the semiconductor device 20 is subjected to a tensile force moment produced by the 45 fused parts 30a.

In this embodiment, as discussed above, only a plurality of target lands selected from among the plurality of device-side lands 23 are coated with the cream solder 40. Accordingly, the moment exerted on the semiconductor device 20 is balanced, so tilting of the semiconductor device 20 is suppressed.

FIG. 8 is a schematic diagram of the moment exerted on the semiconductor device 20 in the melting and solidifying of the fused parts 30a. This moment is actually believed to consist of two kinds of moment: the moment generated according to the surface tension of the melted fused parts 30a (a force that tries to form the fused parts 30a into small balls) and the moment generated according to the shrinkage force when the fused parts 30a solidify.

In FIG. 8, the axis $Q_1$ passes through the center of gravity P of the semiconductor device 20 and is parallel to the opposing face 20S. The axis $Q_2$ passes through the center of gravity P of the semiconductor device 20, is parallel to the opposing face 20S, and is perpendicular to the axis $Q_1$.

As shown in FIG. 8, if we use the axis $Q_1$ as a reference, the semiconductor device 20 is subjected to a resultant moment M1 and a resultant moment M2. The semiconductor device 20 is also subjected to a resultant moment M3 and a resultant moment M4, using the axis $Q_2$ as a reference. The target lands are selected so as to balance the resultant moment M1 and the resultant moment M2, and to balance the resultant moment M3 and the resultant moment M4. As a result, melting and solidification of the 45 fused parts 30a is accompanied by less tilting of the semiconductor device 20. The more axes are used as references, the better the precision at which tilting of the semiconductor device 20 is suppressed.

6. Action and Effect (1) With the circuit board 100 pertaining to this embodiment, the semiconductor device 20 has a plurality of device-side lands 23 disposed asymmetrically in relation to the intersection point B. The device-side lands 23 include the 45 device-side connection lands (the 42 real lands 23R and the three first dummy lands $23D_1$) and the four device-side isolation lands (the four second dummy lands $23D_2$). Each of the device-side connection lands is mechanically connected to the printed board 10 via a connection component 30. Each of the device-side isolation lands is mechanically isolated from the printed board 10.

The inventors conducted diligent study into the cause of cracking that occurs near the boundary between the solder and the device-side lands, which revealed the causes to be the force by which the molten solder tries to form small balls under surface tension, and the force by which the solder tries to shrink while solidifying. More specifically, if all of the asymmetrically disposed device-side lands 23 are soldered to the board-side lands 12, for example, the surface tension on the molten solder and the shrinkage force of the solidifying solder increase in the region where most of the device-side lands 23 are concentrated. Thus, when an unbalanced force acts on the semiconductor device 20, the semiconductor device 20 ends up tilting with respect to the printed board 10.

In view of this, with the circuit board 100 in this embodiment, of the dummy lands 23D, only the first dummy lands $23D_1$ are mechanically connected to the printed board 10, and the second dummy lands $23D_2$ are not mechanically connected to the printed board 10. Therefore, compared to when all of the dummy lands 23D are mechanically joined to the printed board 10, there is less concentration of the solder surface tension and solidification shrinkage force in one part of the semiconductor device 20. Consequently, tilting of the semiconductor device 20 is suppressed, so less cracking and so forth occurs in the connection components 30.

(2) With the circuit board 100 pertaining to this embodiment, the spacing between each of the device-side lands 23 and the printed board 10 is uniform.

Since the connection components 30 are thus all formed at a uniform height, the strength of the connection components 30 can be more uniform than when just some of the connection components 30 are formed in a more slender shape, for example.

(3) With the circuit board 100 pertaining to this embodiment, the opposing face 20S is substantially parallel to the mounting face 10S. Since the connection components 30 are thus all formed at a uniform height, the strength of the connection components 30 can be more uniform.

(4) With the circuit board 100 pertaining to this embodiment, the four device-side isolation lands (the four second dummy lands $23D_2$) are electrically isolated from the semiconductor element 24.

Thus, lands that do not contribute to the function of the semiconductor device 20 are mechanically isolated from the printed board 10. This means that there is no decrease in the function of the semiconductor device 20.

(5) The method for manufacturing the circuit board 100 pertaining to this embodiment comprises a step of coating the 45 board-side connection lands 12a that are some of the board-side lands 12 with the cream solder 40.

Since just the 45 board-side connection lands 12a are coated with the cream solder 40, only the 45 device-side connection lands out of the plurality of device-side lands 23 are mechanically connected to the printed board 10. Therefore, surface tension and solidification shrinkage force of the solder are concentrated in part of the semiconductor device 20 less than when all of the device-side lands 23 are mechanically joined to the printed board 10. As a result, tilting of the semiconductor device 20 can be suppressed, so cracking and the like occur less in the connection components 30.

(6) In the method for manufacturing the circuit board 100 pertaining to this embodiment, when the solder balls 22 are melted and solidified, the moment of the force exerted on the semiconductor device 20 is balanced in relation to axes $Q_1$ and $Q_2$ that pass through the center of gravity of the semiconductor device 20 and are parallel to the opposing face 20S.

Therefore, since tilting of the semiconductor device 20 with respect to the printed board 10 can be suppressed with good precision, soldering defects can also be reduced.

7. Other Embodiments

The present invention was described in the above embodiment, but the text and drawings that make up part of this disclosure should not be construed as limiting this invention. Various alternative embodiments, working examples, and application techniques should be clear from this disclosure to a person skilled in the art.

(A) In the above embodiment, 45 device-side connection lands were disposed asymmetrically in relation to the intersection point B, but they may instead be disposed symmetrically in relation to the intersection point B. In this case, the moment of the force by which the device-side connection lands are pulled to the printed board 10 side via the connection components 30 can be balanced more precisely.

(B) In the above embodiment, the four device-side isolation lands consisted of the four second dummy lands $23D_2$ that were not electrically connected to the semiconductor element 24, but this is not the only option. For example, the four device-side isolation lands may be selected from the real lands 23R that are electrically connected to the semiconductor element 24. In this case, some of the plurality of signal terminals, some of the plurality of power supply terminals, and some of the plurality of grounding terminals for transmitting the same signal superimposed are preferably selected as the real lands 23R used as the four device-side isolation lands. This suppresses the decrease in the function of the semiconductor device 20 that happens when the device-side isolation lands are selected from among the real lands 23R.

(C) In the above embodiment, the plurality of device-side lands 23 included the 42 real lands 23R, the three first dummy lands $23D_1$, and the four second dummy lands $23D_2$, but each of these lands may be used in other numbers. The device-side lands 23 may include two or more real lands 23R and one or more second dummy lands $23D_2$, and may not include any first dummy lands $23D_1$. If the device-side lands 23 include just one second dummy land $23D_2$, then the orientation of the semiconductor device 20 may be determined automatically by a conveyor robot by, for example, omitting one of the device-side lands 23 arranged in a matrix of n×m rows.

(D) In the above embodiment, as shown in FIG. 6, the isolation balls 22b were physically (mechanically and electrically) isolated from the board-side isolation lands 12b, but this is not the only option. The isolation balls 22b may be electrically connected to the board-side isolation lands 12b. Specifically, the isolation balls 22b just need not to be mechanically joined to the board-side isolation lands 12b, and contact is permitted. In this case, since the second dummy lands $23D_2$ are electrically isolated from the semiconductor element 24, they do not affect the function of the semiconductor device 20.

(E) In the above embodiment, the spacing W between the printed board 10 and the device-side connection lands was uniform, but this is not the only option. The spacing W between the printed board 10 and the device-side connection lands may fall within a specific range. This specific range can be set so that cracking does not occur in the connection components 30. As long as this is true, the opposing face 20S need not be completely parallel to the mounting face 10S.

(F) In the above embodiment, the device-side isolation lands were mechanically isolated from the board-side isolation lands 12b by not coating the board-side isolation lands 12b with the cream solder 40, but this is not the only option.

For example, the device-side isolation lands can also be mechanically isolated from the board-side isolation lands 12b by not providing the isolation balls 22b on the device-side isolation lands.

Thus, the present invention of course includes various embodiments, etc. not discussed herein. Therefore, the technological scope of the present invention is determined only by the invention-specifying particulars pertaining to the corresponding patent claims, as described above.

INDUSTRIAL APPLICABILITY

The above embodiment can provide a circuit board with which soldering defects can be suppressed, and a method for manufacturing this circuit board, and as such as is useful in the field of electronic devices.

REFERENCE SIGNS LIST 10 printed board
10S mounting face
11 board main body
12 plurality of board-side lands
12a board-side connection land
12b board-side isolation land
20 semiconductor device
20S opposing face
21 package board
22 plurality of solder balls
22a connection ball
22b isolation ball
23 plurality of device-side lands
23R real land
23D dummy land
23D$_1$ first dummy land
23D$_2$ second dummy land
23 semiconductor element
23 plurality of device-side lands
24 semiconductor element
25 first internal wire
26 second internal wire
27 wire
28 electrode
29 housing
30 connection component
30a fused part
40 cream solder
A, B intersection point
C perpendicular line

The invention claimed is:

1. A circuit board comprising:
a printed board; and
a semiconductor device being mounted to the printed board and including a semiconductor element and a plurality of device-side lands each including solder, the plurality of device-side lands disposed asymmetrically in relation to a specific reference point,
the plurality of device-side lands having a plurality of device-side connection lands and a device-side isolation land, the plurality of device-side connection lands electrically connected to the printed board with the solder, the device-side isolation land including the solder being mechanically isolated from the printed board by a spacing provided therebetween, and
the plurality of device-side connection lands including a real land which is electrically connected to the semiconductor element and a dummy land which is electrically isolated from the semiconductor element,
wherein a volume of the solder on the plurality of device-side connection lands before joining to the printed circuit board and a volume of the solder on the device-side isolation land are substantially same.

2. The circuit board according to claim 1, wherein a spacing between each of the plurality of device-side lands and the printed board is substantially uniform.

3. The circuit board according to claim 1, wherein the printed board has a mounting face to which the semiconductor device is mounted,
the semiconductor device has an opposing face which opposes the mounting face of the printed board, and
the opposing face is substantially parallel to the mounting face.

4. The circuit board according to claim 1, wherein the plurality of device-side connection lands are disposed in point symmetry in relation to the specific reference point.

5. The circuit board according to claim 1, wherein the device-side isolation land is electrically isolated from the semiconductor element.

6. A method for manufacturing a circuit board comprising:
coating a plurality of board-side connection lands with cream solder, the plurality of board-side connection lands being included in a plurality of board-side lands, the plurality of board-side lands being provided to a printed board and being disposed asymmetrically in relation to a specific reference point;
joining the plurality of board-side connection lands to some of a plurality of device-side lands by melt-solidifying solder balls with the cream solder, the plurality of device-side lands corresponding to the plurality of board-side lands, the cream solder being coated on the plurality of board-side connection lands, the solder balls being provided to a semiconductor device including a semiconductor element and being formed on the plurality of device-side lands;
forming the plurality of device-side lands to include a plurality of device-side connection lands and a device-side isolation land, the plurality of device-side connection lands being electrically connected to the printed board with the solder, the device-side isolation land including the solder being mechanically isolated from the printed board by a spacing provided therebetween; and
forming the plurality of device-side connection lands to include a real land which is electrically connected to the semiconductor element and a dummy land which is electrically isolated from the semiconductor element,
wherein a volume of the solder on the plurality of device-side connection lands before joining to the printed circuit board and a volume of the solder on the device-side isolation land are substantially same.

7. The method for manufacturing a circuit board according to claim 6, wherein
in the coating of the plurality of board-side connection lands with cream solder, a board-side land of the plurality of board-side lands which is different from the board-side connection lands is not coated with the cream solder.

8. The method for manufacturing a circuit board according to claim 6, wherein
in the joining the plurality of board-side connection lands to some of the plurality of device-side lands, when the solder balls are melted and then solidify and shrink, the moment of the force by which the plurality of device-side lands are pulled by the solder to the printed board side is balanced in relation to an axis line, the axis line passing through a center of gravity of the semiconductor device and being parallel to an opposing face of the semiconductor device, the opposing face opposing the printed board.

9. A circuit board comprising:
a printed board; and
a semiconductor device mounted to the printed board,
the semiconductor device including a semiconductor element and a plurality of device-side lands each including solder, and the plurality of device-side lands being disposed asymmetrically in relation to a specific reference point,
the plurality of device-side lands including a plurality of dummy lands and a plurality of real lands,
the plurality of dummy lands being electrically isolated from the semiconductor element and including one or more first dummy lands and one or more second dummy lands,
the plurality of real lands of the semiconductor device and the one or more first dummy lands are electrically connected to a plurality of connection lands of the printed board with the solder, and
the one or more second dummy lands of the semiconductor device including the solder being mechanically isolated from corresponding one or more isolation lands of the printed board by a spacing provided therebetween,
wherein a volume of the solder on the plurality of real lands and the one or more first dummy lands before joining to the printed circuit board and a volume of the solder on the one or more second dummy lands are substantially same.

10. The circuit board according to claim 1, wherein the plurality of device-side lands are terminals including foil.

11. The method according to claim 6, wherein the plurality of device-side lands are terminals including foil.

12. The circuit board according to claim 9, wherein the plurality of device-side lands are terminals including foil.

13. The circuit board according to claim 1, further comprising:
a plurality of board-side connection lands corresponding to the plurality of device-side connection lands, and a board-side isolation land corresponding to the device-side isolation land;
wherein the board-side connection lands and the board-side isolation land have a same configuration; and
wherein the board-side connection lands are coated with cream solder and the board-side isolation land is not coated with cream solder.

14. The method for manufacturing a circuit board according to claim 6, wherein
a board-side isolation land is included in the plurality of board-side lands;
the plurality of board-side connection lands correspond to the plurality of device-side connection lands, and the board-side isolation land corresponds to the device-side isolation land;
the board-side connection lands and the board-side isolation land have a same configuration; and
the board-side isolation land is not coated with cream solder.

15. The circuit board according to claim 9, wherein
the plurality of connection lands of the printed board and the one or more isolation lands of the printed board have a same configuration; and
the plurality of connection lands of the printed board are coated with cream solder and the one or more isolation lands of the printed board is not coated with cream solder.

* * * * *